United States Patent [19]

Sugahara

[11] Patent Number: 5,801,434
[45] Date of Patent: Sep. 1, 1998

[54] TAB TAPE AND SEMICONDUCTOR DEVICE INCLUDING TAB TAPE

[75] Inventor: Kenji Sugahara, Tokyo, Japan

[73] Assignee: NEC Corporation, Japan

[21] Appl. No.: 690,126

[22] Filed: Jul. 31, 1996

[30] Foreign Application Priority Data

Aug. 30, 1995 [JP] Japan .................. 7-221897

[51] Int. Cl.$^6$ .............................................. H01L 23/495
[52] U.S. Cl. ........................ 257/668; 257/665; 257/692
[58] Field of Search ................................ 257/691, 668, 257/685, 665, 696, 692

[56] References Cited

U.S. PATENT DOCUMENTS 4,801,999 1/1989 Hayward et al. ................ 257/668
5,473,190 12/1995 Inoue et al. ..................... 257/691

Primary Examiner—Tom Thomas
Assistant Examiner—Roy Potter
Attorney, Agent, or Firm—Hayes, Soloway, Hennessey, Grossman & Hage, P.C.

[57] ABSTRACT

There is provided a tape automated bonding (TAB) tape including, a first film having a first open space therewithin, a second film having a second open space therewithin, the first film being located in the second open space, a third film located in the first open space of the first film, a first closed-loop wiring formed on the second film, a second closed-loop wiring formed on the third film, at least one signal wiring formed on the first film, and at least one ground wiring formed on the first film, the ground wiring inwardly and outwardly extending from the first film to connect the first and second closed-loop wirings to each other. The TAB tape makes it possible to increase the number of the ground wirings by providing the closed-loop wirings. As a result, it is possible to reduce effective inductance and ground bounce noises of the ground wirings, and further possible to reduce mutual capacities among the signal wirings with the result of reduced cross-talk noises.

23 Claims, 7 Drawing Sheets

TAB TAPE AND SEMICONDUCTOR DEVICE INCLUDING TAB TAPE

BACKGROUND OF THE INVENTION

1. Field of the Invention

The invention relates to a tape automated bonding (TAB) tape and a semiconductor device including a TAB tape, and more particularly to an improvement in them for reducing effective inductance, ground bounce noises and cross-talk noises.

2. Description of the Related Art

Recently, for the purpose of reducing a size of electronic devices, there has been widely used a semiconductor device including a tape automated bonding (TAB) tape which can be mounted on a surface of a substrate of electronic devices in high density.

A conventional semiconductor device with a TAB tape is illustrated in FIGS. 1A and 1B. As illustrated, the semiconductor device includes a TAP tape and a semiconductor element 6. The TAB tape comprises of an insulating organic film 1 such as a polyimide film which has a frame-like shape. Namely, the film 1 is rectangular in shape, and has a rectangular open space 1a therein. The semiconductor element 6 is located in the rectangular open space 1a. A plurality of electrodes 7 are arranged on the semiconductor element 6 in a line along four sides thereof.

There are formed a plurality of signal wirings 2 and ground wirings 3 on the film 1. These wirings 2 and 3 are formed, for instance, by depositing a thin metallic film such as a copper film on the film 1 and wet-etching the thin metallic film. The signal and ground wirings 2 and 3 extend inwardly from the film 1 to electrically connect with the electrodes 7. In addition, the signal and round wirings 2 and 3 outwardly extend slightly beyond the film 1. When the illustrated semiconductor device is to be mounted on an electronic device, the signal and ground wirings 2 and 3 extending outwardly from the film 1 are electrically connected to electrodes formed on a substrate of an electronic device.

In the illustrated conventional semiconductor device with a TAB tape, the electrodes 7 formed on the semiconductor element 6 are connected with the electrodes formed on a substrate of an electronic device one to one through the wirings 2 and 3 formed on the polyimide film 1. Thus, with higher speed operation and higher integration of a semiconductor element, there arises a problem of ground bounce noise to be produced by inductance ingredients in power supply and ground wirings. The ground bounce noise is represented by a following equation:

$$dV = n \times Leff \times dI/dt$$

wherein "Leff" indicates effective inductance of power supply or ground wirings, and "n" indicates the simultaneous operation number of a semiconductor element. The number "n" increases as a semiconductor element is more highly integrated, and "dI/dt" also increases as a semiconductor element is operated in higher rate. Accordingly, it is necessary to reduce effective inductance in power supply or ground wirings in a semiconductor device in order to reduce the ground bounce noise.

However, in a conventional semiconductor device including a TAB tape for electrically connecting pads formed on a semiconductor element with electrodes formed on a substrate of an electronic device one to one through wirings formed by etching thin metallic films, it is impossible to reduce effective inductance because there is a limited range in thickness and width of metallic films for the formation of power supply and ground wirings.

With respect to the signal wirings, since the signal wirings are formed in the vicinity of each other on the polyimide film, there is produced cross-talk noise due to mutual capacities between the signal wirings. Thus, there arises a problem that a semiconductor element cannot be operated at high rate.

In order to solve the above mentioned problems, there has been adopted a TAB tape including a polyimide film having thin metallic films formed on opposite surfaces thereof. The thin metallic films are etched into signal, ground and power supply wirings on an upper surface of the polyimide film, and the ground wirings are electrically connected with the metallic films formed on a lower surface of the polyimide film. Thus, an entire lower surface of the polyimide film can be used as a ground wiring. According to the TAB tape, it is possible to reduce the effective inductance of ground wirings, thereby reducing the ground bounce noises.

In addition, the above mentioned TAB tape can reduce mutual capacities between the signal wirings, and hence it is possible to increase the simultaneous operation number with the result of reduction of cross-talk noises.

However, a semiconductor device including the above mentioned TAB tape needs three to four times higher fabrication cost than a TAB tape including a single metallic film formed thereon.

SUMMARY OF THE INVENTION

In view of the foregoing problems of a prior TAB tape, it is an object of the present invention to provide a TAB tape capable of reducing effective inductance, ground bounce noise and cross-talk noise of ground wirings without forming metallic films on opposite surfaces of the TAB tape.

Another object of the present invention is to provide a semiconductor device with a TAB tape which device can operate at high speed and can be highly integrated with decreased fabrication costs.

In one aspect, there is provided a tape automated bonding tape including a first film having a first open space therewithin, a second film having a second open space therewithin, the first film being located in the second open space, a closed-loop wiring formed on the second film, at least one signal wiring formed on the first film, and at least one ground wiring formed on the first film, the ground wiring outwardly extending from the first film to connect with the closed-loop wiring.

It is preferable that the first and second films are rectangular in shape, and that the first and second open spaces are rectangular in shape, in which case, there may be formed four ground wirings so that each of them is located on each of four sides of the rectangular-shaped first film.

For instance, the first and second films may be made of polyimide.

There is further provided a tape automated bonding tape including a first film having a first open space therewithin, a second film located in the first open space, a closed-loop wiring formed on the second film, at least one signal wiring formed on the first film, and at least one ground wiring formed on the first film, the ground wiring inwardly extending from the first film to connect the closed-loop wiring.

The second film may have an open space therein, and the open space is preferable rectangular in shape.

There is still further provided a tape automated bonding tape including a first film having a first open space therewithin, a second film having a second open space therewithin, the first film being located in the second open space, a third film located in the first open space of the first film, a first closed-loop wiring formed on the second film, a second closed-loop wiring formed on the third film, at least one signal wiring formed on the first film, and at least one ground wiring formed on the first film, the ground wiring inwardly and outwardly extending from the first film to connect the first and second closed-loop wirings to each other.

It is preferable that a plurality of signal and ground wirings are formed on the first film so that each of the ground wirings is located intermediate between the signal wirings.

In another aspect, there is provided a semiconductor device including a first film having a first open space therewithin, a semiconductor element being located within the first open space of the first film, terminals formed on the semiconductor element, a second film having a second open space therewithin, the first film being located in the second open space, a closed-loop wiring formed on the second film, at least one signal wiring formed on the first film, and at least one ground wiring formed on the first film, the ground wiring inwardly extending from the first film to terminate at one of the terminals and outwardly extending from the first film to connect with the closed-loop wiring.

There is further provided a semiconductor device including a first film having a first open space therewithin, a semiconductor element being located within the first open space of the first film, terminals formed on the semiconductor element, a second film lying on the semiconductor element inside an arrangement of the terminals, a closed-loop wiring formed on the second film, at least one signal wiring formed on the first film and inwardly extending from the first film to terminate at one of the terminals, and at least one ground wiring formed on the first film, the ground wiring inwardly extending from the first film to connect the closed-loop wiring through one of the terminals.

There is still further provided a semiconductor device including a first film having a first open space therewithin, a semiconductor element being located within the first open space of the first film, terminals formed on the semiconductor element, a second film having a second open space therewithin, the first film being located in the second open space, a third film lying on the semiconductor element inside an arrangement of the terminals, a first closed-loop wiring formed on the second film, a second closed-loop wiring formed on the third film, at least one signal wiring formed on the first film, the signal wiring inwardly extending from the first film to terminate at one of the terminals, and at least one ground wiring formed on the first film, the ground wiring inwardly extending from the first film to connect with the second closed-loop wiring through one of the terminals and outwardly extending from the first film to connect with the first closed-loop wiring.

Namely, the above mentioned three semiconductor devices include the firstly, secondly and thirdly mentioned TAB tapes, respectively.

The above mentioned semiconductor devices in accordance with the present invention makes it possible to reduce the effective inductance of the ground wirings and the mutual capacities between the signal wirings with the signal wirings being provided only on a surface of the TAB tape.

In the TAB tape made in accordance with the present invention, there is(are) formed first and/or second closed-loop wiring(s) to which the ground wirings are electrically connected to thereby render the ground wirings to be in ground potential. In addition, there may be formed a plurality of additional ground wirings between the adjacent signal wirings, which ground wirings are connected to the first and/or second closed-loop wiring(s). Thus, it is possible to increase the number of the ground wirings formed in parallel on the TAB tape to thereby reduce the self-inductance.

In addition, current runs in opposite directions in adjacent ground and signal wirings in the arrangement of ground and signal wirings of the present invention. Thus, the mutual inductance between the ground and signal wirings becomes a minus value, and hence there can be obtained advantages of reducing both the effective inductance of the ground wirings and the ground bounce noises to be produced in simultaneous operation.

The TAB tape and semiconductor device made in accordance with the present invention can provide ground potential wirings between the signal wirings. As a result, it is possible to remarkably reduce the mutual capacities between the signal wirings, and accordingly it is also possible to reduce cross-talk noises.

Hence, the semiconductor device including the above mentioned TAB tape makes it possible to operate at higher speed and have higher integration than a conventional semiconductor device with no fabrication cost up.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings, in which.

DESCRIPTION OF THE PREFERRED EMBODIMENTS

Figure 1A:
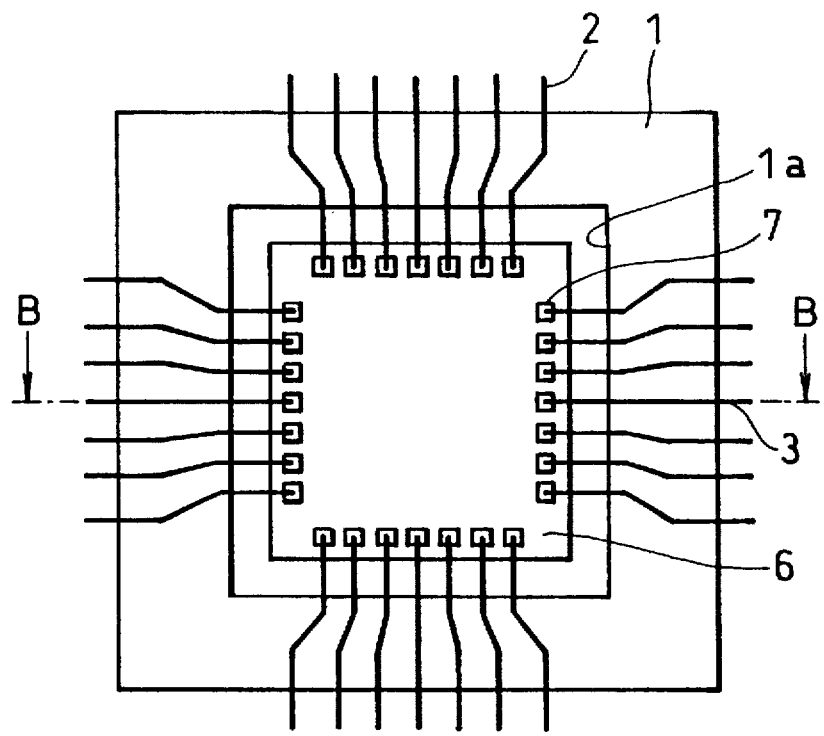
FIG. 1A is a plan view illustrating a conventional semiconductor device with a TAB tape.
Figure 1B:
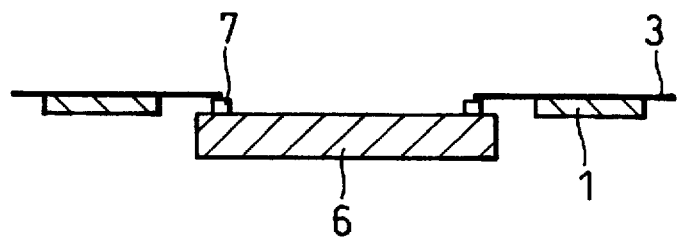
FIG. 1B is a cross-sectional view taken along the line B—B in FIG. 1A.
Figure 2:
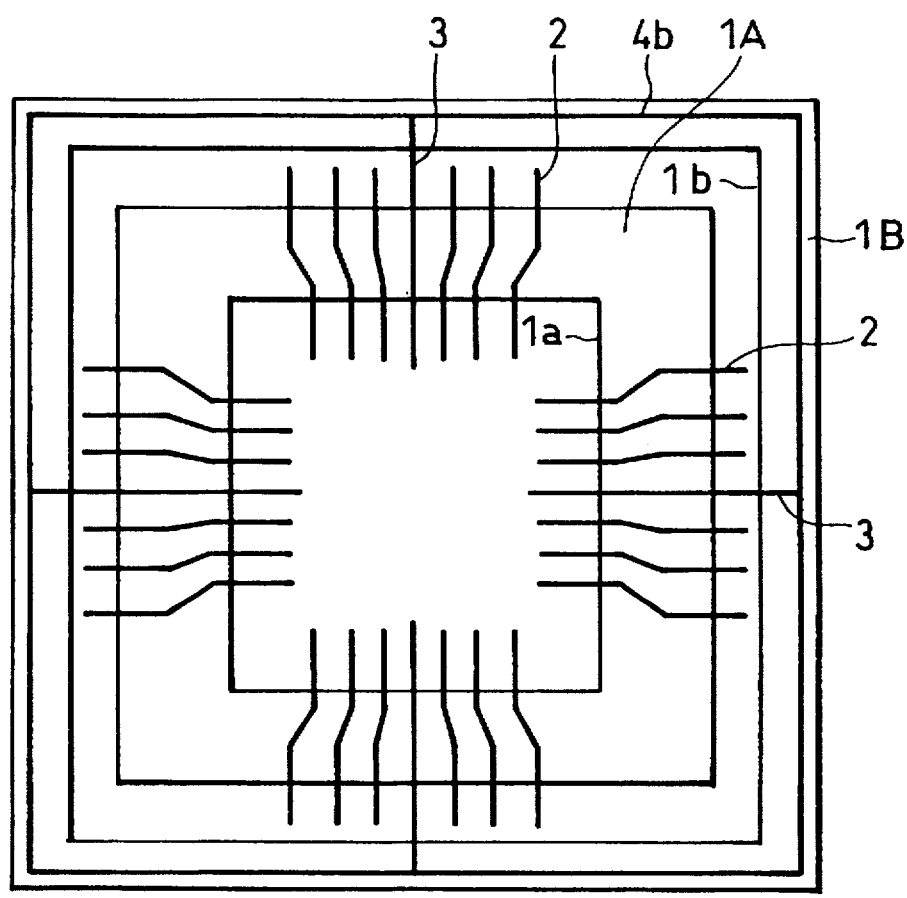
FIG. 2 is a plan view of a TAB tape in accordance with the first embodiment of the present invention.

With reference to FIG. 2, hereinbelow is described a TAB tape made in accordance with the first embodiment of the present invention. As illustrated, the TAB tape has a rectangular first film 1A having a rectangular opening 1a therein. The first film 1A is surrounded by a second film 1B which is rectangular in shape and has a rectangular opening 1b. Namely, the first film 1A is located in the opening 1b of the second film 1B. The first and second films 1A and 1B are made of organic insulating material such as polyimide.

A rectangular closed-loop wiring 4b is formed on the second film 1B. There are formed totally twenty four signal wirings 2 on the first film 1A. Specifically, a set of six signal wirings 2 is formed on each of four sides of the rectangle constituted by the first film 1A. The signal wirings 2 extend inwardly and outwardly slightly from the first film 1A.

There are also formed four ground wirings 3 on the first film 1A. Specifically, one ground wiring 3 is formed on each of four sides of the rectangle constituted by the first film 1A. The ground wirings 3 extend inwardly slightly from the first film 1A and extend outwardly from the first film 1A to thereby electrically connect with the closed-loop wiring 4b. These signal and ground wirings 2 and 3 may be formed by depositing a thin metallic film such as a copper film on the first film 1A and wet-etching the thin metallic film.

Figure 3A:
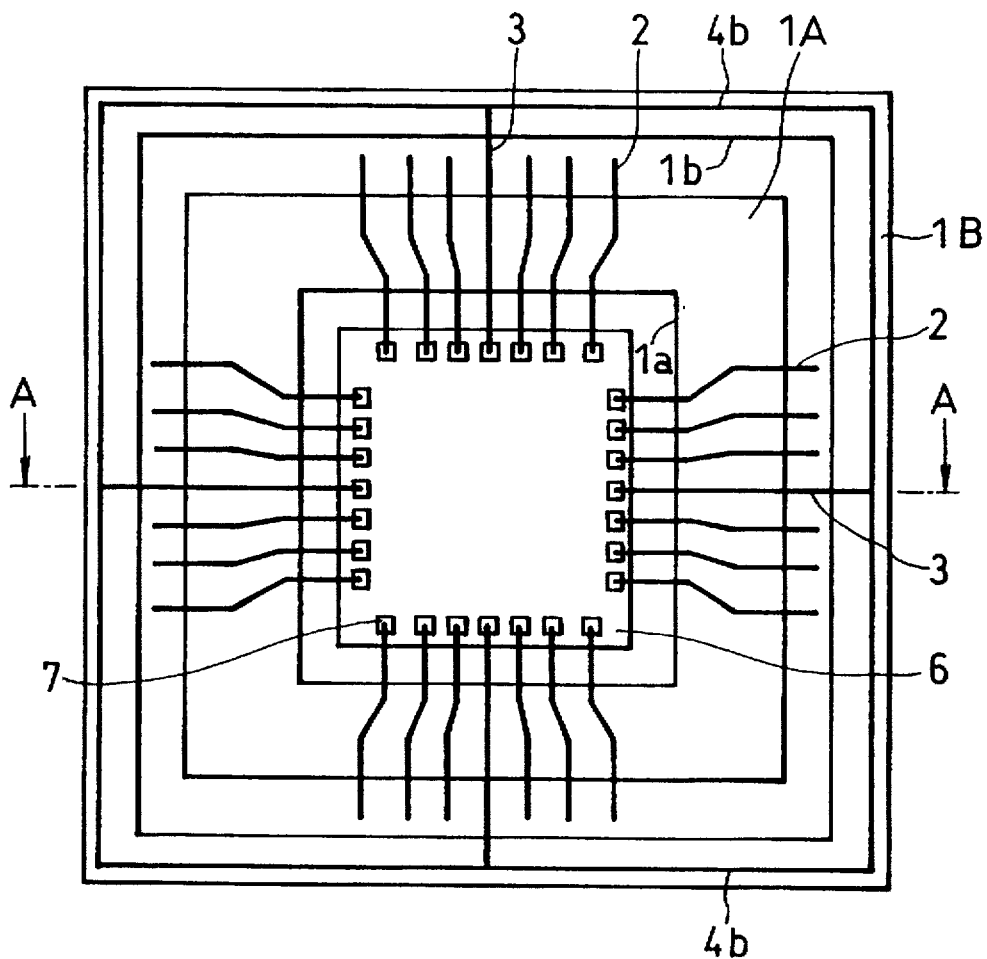
FIG. 3A is a plan view of a semiconductor device to which the TAB tape illustrated in FIG. 2 is applied.
Figure 3B:
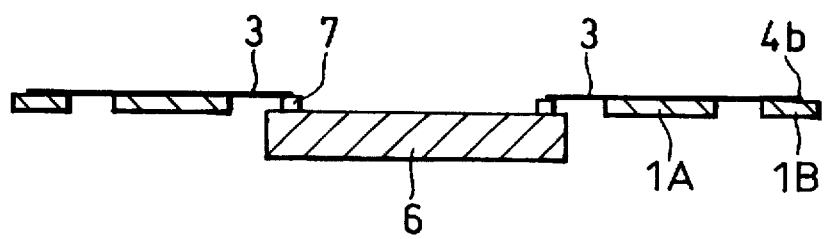
FIG. 3B is a cross-sectional view taken along the line A—A in FIG. 3A.

FIGS. 3A and 3B illustrate a semiconductor device to which the TAB tape illustrated in FIG. 2 is applied. The illustrated semiconductor device includes the TAB tape illustrated in FIG. 2 and a semiconductor element 6. The semiconductor element 6 is disposed in the first opening 1a of the first film 1A On the semiconductor element 6 are formed the same number of electrodes 7 in a line along four sides of the semiconductor element 6 as the total number of the signal and ground wirings 2 and 3.

The signal and ground wirings 2 and 3 extend inwardly from the first film 1A, as described earlier, to thereby terminate at or connect with the electrodes 7. Thus, the semiconductor element 6 is electrically connected with the TAB tape.

The signal wirings 2 extend outwardly from the first film 1A, as described earlier, to thereby connect with external equipments (not illustrated). The ground wirings 3 are also electrically connected with external equipments in the vicinity of bonding points of the ground wirings 3 with the closed-loop wiring 4b. Thus, the semiconductor element 6 is electrically connected with the external equipments.

Figure 4:
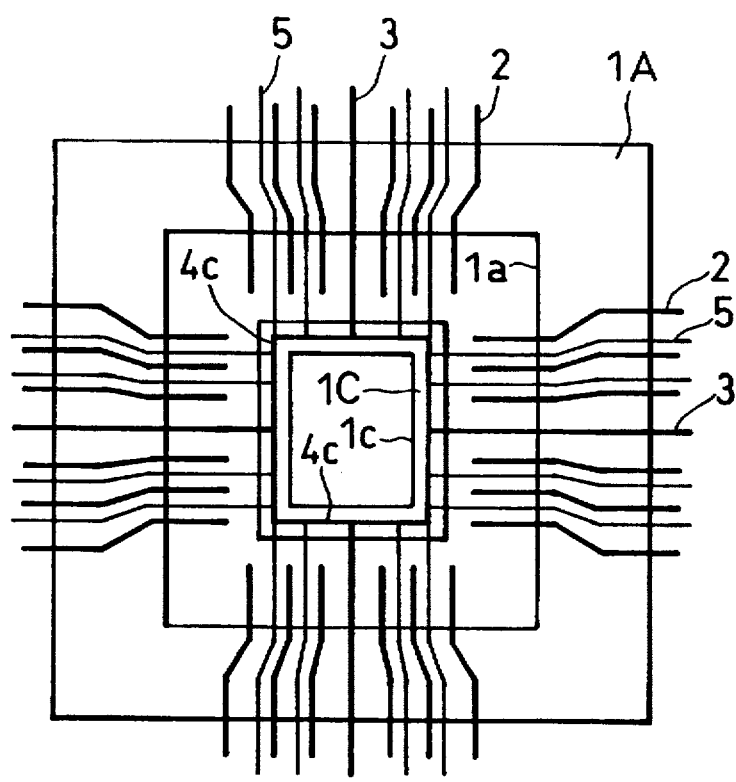
FIG. 4 is a plan view of a TAB tape in accordance with the second embodiment of the present invention.

Turning to FIG. 4, hereinbelow is described a TAB tape made in accordance with the second embodiment of the present invention. As illustrated, the TAB tape has a rectangular first film 1A having a rectangular opening 1a therein. Within the opening 1a of the first film 1A is disposed a second film 1c which is rectangular in shape and has a rectangular opening 1c. The first and second films 1A and 1C are made of organic insulating material such as polyimide.

The second film 1C has a rectangular closed-loop wiring 4c formed thereon. There are formed totally twenty four signal wirings 2 on the first film 1A. Specifically, a set of six signal wirings 2 is formed on each of four sides of the rectangle constituted by the first film 1A. The signal wirings 2 extend inwardly and outwardly slightly from the first film 1A.

There are also formed four ground wirings 3 on the first film 1A. Specifically, one ground wiring 3 is formed on each of four sides of the rectangle constituted by the first film 1A. The ground wirings 3 extend inwardly from the first film 1A toward the second film 1C to terminate at or connect with the rectangular closed-loop wiring 4c, and extend outwardly slightly. These signal and ground wirings 2 and 3 may be formed by depositing a thin metallic film such as a copper film on the first film 1A and wet-etching the thin metallic film.

A plurality of ground potential wirings 5 are formed on the first film 1A. The ground potential wirings 5 extend between the adjacent signal wirings 2 inwardly toward the second film 1C from the first film 1A and electrically connect the closed-loop wiring 4c.

Figure 5A:
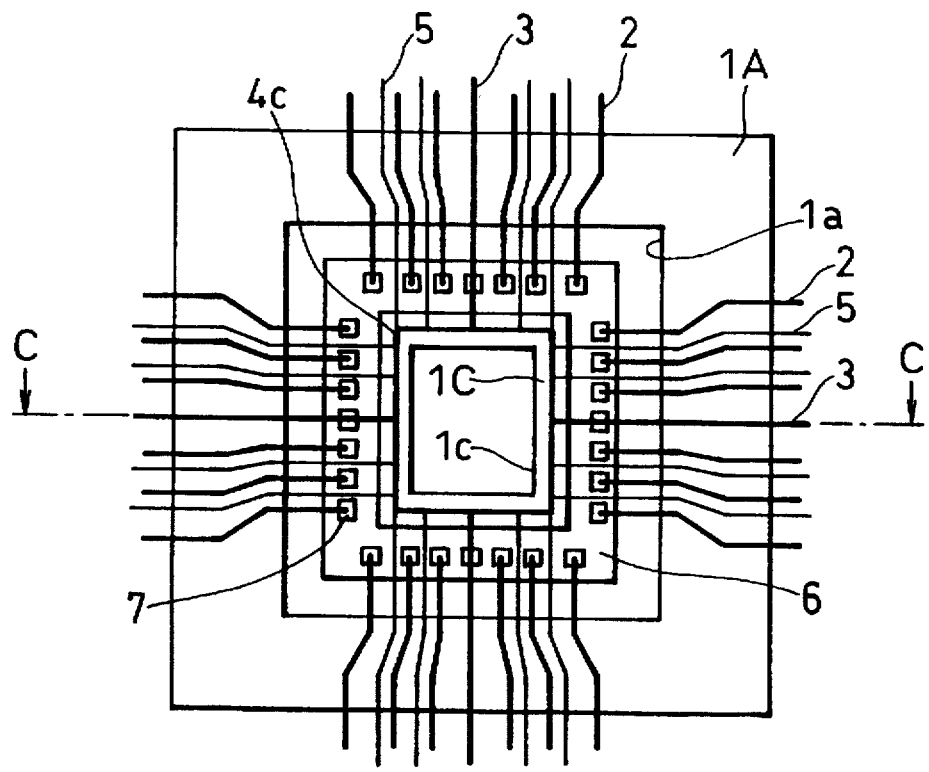
FIG. 5A is a plan view of a semiconductor device to which the TAB tape illustrated in FIG. 4 is applied.
Figure 5B:
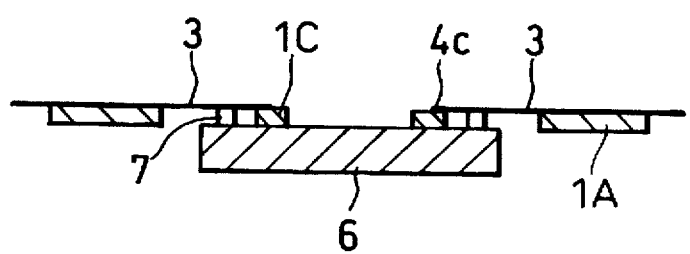
FIG. 5B is a cross-sectional view taken along the line C—C in FIG. 5A.

FIGS. 5A and 5B illustrate a semiconductor device to which the TAB tape illustrated in FIG. 4 is applied. The illustrated semiconductor device includes the TAB tape illustrated in FIG. 4 and a semiconductor element 6. The semiconductor element 6 is disposed in the first opening 1a of the first film 1A On the semiconductor element 6 are formed the same number of electrodes 7 in a line along four sides of the semiconductor element 6 as the total number of the signal and ground wirings 2 and 3. The third film 1C lies on the semiconductor element 6 within an arrangement of the electrodes 7.

The signal wirings 2 extend inwardly from the first film 1A, as described earlier, to thereby terminate at or connect with the electrodes 7. The ground wirings 3 are electrically connected to the electrodes 7 intermediate between the first film 1A and the closed-loop wiring 4c. Thus, the semiconductor element 6 is electrically connected with the TAB tape.

The signal wirings 2 extend outwardly from the first film 1A, as described earlier, to thereby connect with external equipments (not illustrated). The ground wirings 3 and 5 are also electrically connected with external equipments outside the first film 1A. Thus, the semiconductor element 6 is electrically connected with the external equipments.

Figure 6:
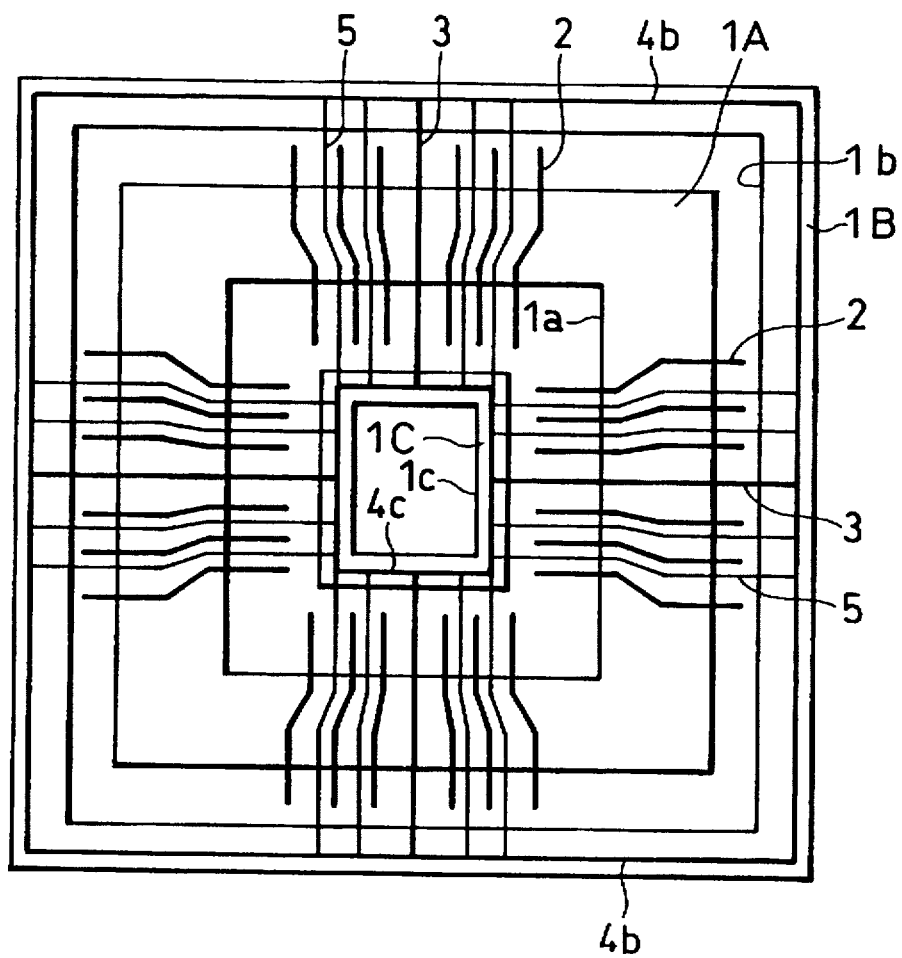
FIG. 6 is a plan view of a TAB tape in accordance with the third embodiment of the present invention.

Turning to FIG. 6, hereinbelow is described a TAB tape made in accordance with the third embodiment of the present invention. As illustrated, the TAB tape has a rectangular first film 1A having a rectangular opening 1a therein. The first film 1A is surrounded by a second film 1B which is rectangular in shape and has a rectangular opening 1b. Namely, the first film 1A is located in the opening 1b of the second film 1B. Within the opening 1a of the first film 1A is disposed a third film 1c which is rectangular in shape and has a rectangular opening 1c. The first, second and third films 1A, 1B and 1C are made of organic insulating material such as polyimide.

First and second rectangular closed-loop wirings 4b and 4c are formed on the second and third films 1B and 1C, respectively. There are formed totally twenty four signal wirings 2 on the first film 1A. Specifically, a set of six signal wirings 2 is formed on each of four sides of the rectangle constituted by the first film 1A. The signal wirings 2 extend inwardly and outwardly slightly from the first film 1A towards the third and second films 1C and 1B.

There are also formed four ground wirings 3 on the first film 1A. Specifically, one ground wiring 3 is formed on each of four sides of the rectangle constituted by the first film 1A. The ground wirings 3 extend inwardly and outwardly from the first film 1A to thereby electrically connect the first and second closed-loop wirings 4b and 4c to each other. These signal and ground wirings 2 and 3 may be formed by depositing a thin metallic film such as a copper film on the first film 1A and wet-etching the thin metallic film.

A plurality of ground potential wirings 5 extend between the adjacent signal wirings 2 to thereby electrically connect the first and second closed-loop wirings 4b and 4c to each other.

Figure 7A:
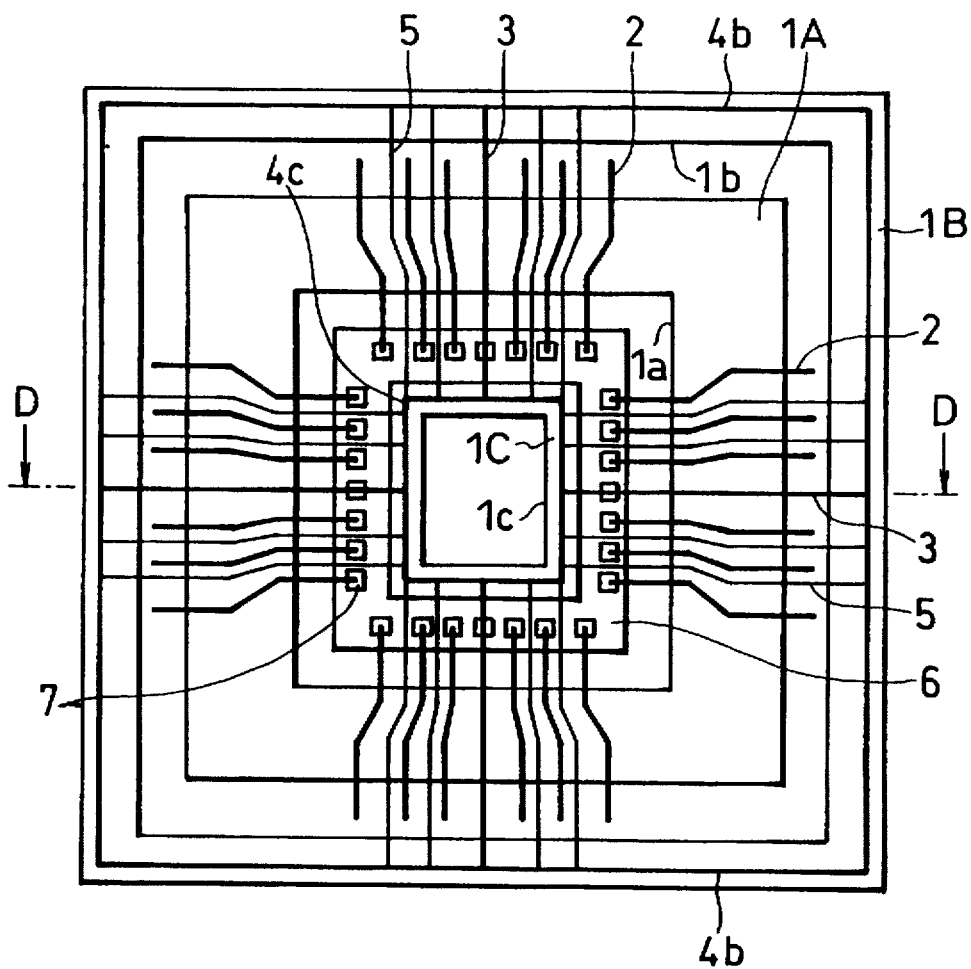
FIG. 7A is a plan view of a semiconductor device to which the TAB tape illustrated in FIG. 6 is applied.
Figure 7B:
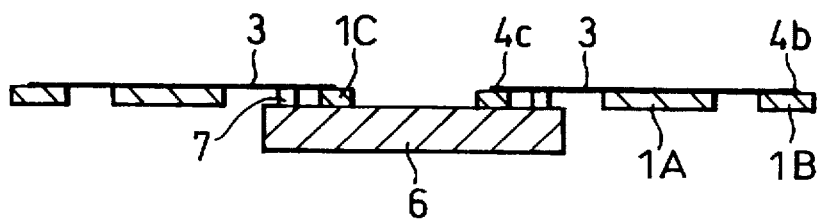
FIG. 7B is a cross-sectional view taken along the line D—D in FIG. 7A.

FIGS. 7A and 7B illustrate a semiconductor device to which the TAB tape illustrated in FIG. 6 is applied. The illustrated semiconductor device includes the TAB tape illustrated in FIG. 6 and a semiconductor element 6. The semiconductor element 6 is disposed in the first opening 1a of the first film 1A On the semiconductor element 6 are formed the same number of electrodes 7 in a line along four sides of the semiconductor element 6 as the total number of the signal and ground wirings 2 and 3. The third film 1C lies on the semiconductor element 6 within an arrangement of the electrodes 7.

The signal wirings 2 extend inwardly from the first film 1A, as described earlier, to thereby terminate at or connect with the electrodes 7. The ground wirings 3 are electrically connected to the electrodes 7 intermediate between the first film 1A and the second closed-loop wiring 4c. Thus, the semiconductor element 6 is electrically connected with the TAB tape.

The signal wirings 2 extend outwardly from the first film 1A, as described earlier, to thereby connect with external equipments (not illustrated). The ground wirings 3 are also electrically connected with external equipments in the vicinity of bonding points of the ground wirings 3 with the first closed-loop wiring 4b. Thus, the semiconductor element 6 is electrically connected with the external equipments.

In the above mentioned first to third embodiments, although not illustrated, the semiconductor element 6 may be entirely covered with protective material such as a resin in order to protect the semiconductor element 6 from external environment after the semiconductor element 6 has been electrically connected with the TAB tape.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A tape automated bonding tape comprising:
   a first film having a first open space therewithin;
   a second film having a second open space therewithin, said first film being located in said second open space;
   a closed-loop wiring formed on said second film;
   at least one signal wiring formed on said first film; and
   at least one ground wiring formed on said first film, said ground wiring outwardly extending from said first film to connect with said closed-loop wiring.

2. The tape automated bonding tape as set forth in claim 1, wherein said first and second films are rectangular in shape, and said first and second open spaces are rectangular in shape.

3. The tape automated bonding tape as set forth in claim 2, wherein there are formed four ground wirings so that each them is located on each of four sides of said rectangular-shaped first film.

4. The tape automated bonding tape as set forth in claim 1, wherein said first and second films are made of polyimide.

5. A tape automated bonding tape comprising:
   a rectangular-shaped first film having a rectangular-shaped first open space therewithin;
   a rectangular-shaped second film located in said first open space;
   a closed-loop wiring formed on said second film;
   at least one signal wiring formed on said first film; and
   four ground wirings formed on said first film, one of said four ground wirings being located, respectively, on one of said four sides of said rectangular-shaped film, each of said ground wirings inwardly extending from said first film to connect said closed-loop wiring.

6. The tape automated bonding tape as set forth in claim 5, wherein a plurality of signal and ground wirings are formed on said first film so that each of said ground wirings is located intermediate between said signal wirings.

7. The tape automated bonding tape as set forth in claim 5, wherein said first and second films are made of polyimide.

8. The tape automated bonding tape as set forth in claim 5, wherein said second film has an open space therewithin.

9. A tape automated bonding tape comprising:
   a first film having a first open space therewithin;
   a second film having a second open space therewithin, said first film being located in said second open space;
   a third film located in said first open space of said first film;
   a first closed-loop wiring formed on said second film;
   a second closed-loop wiring formed on said third film;
   at least one signal wiring formed on said first film; and
   at least one ground wiring formed on said first film, said ground wiring inwardly and outwardly extending from said first film to connect said first and second closed-loop wirings to each other.

10. The tape automated bonding tape as set forth in claim 9, wherein a plurality of signal and ground wirings are formed on said first film so that each of said ground wirings is located intermediate between said signal wirings.

11. The tape automated bonding tape as set forth in claim 9, wherein said first, second and third films are rectangular in shape, and said first and second open spaces are rectangular in shape.

12. The tape automated bonding tape as set forth in claim 11, wherein there are formed four ground wirings so that each of them is located on each of four sides of said rectangular-shaped first film.

13. The tape automated bonding tape as set forth in claim 9, wherein said first, second and third films are made of polyimide.

14. The tape automated bonding tape as set forth in claim 9, wherein said third film has an open space therewithin.

15. A semiconductor device comprising:
   a first film having a first open space therewithin;
   a semiconductor element being located within said first open space of said first film;
   terminals formed on said semiconductor element;
   a second film having a second open space therewithin, said first film being located in said second open space;
   a closed-loop wiring formed on said second film;
   at least one signal wiring formed on said first film; and
   at least one ground wiring formed on said first film, said ground wiring inwardly extending from said first film to terminate at one of said terminals and outwardly extending from said first film to connect with said closed-loop wiring.

16. The semiconductor device as set forth in claim 15, wherein said first and second films are rectangular in shape, and said first and second open spaces are rectangular in shape.

17. The semiconductor as set forth in claim 16, wherein there are formed four ground wirings so that each of them is located on each of four sides of said rectangular-shaped first film.

18. A semi-conductor device comprising:
   a rectangular-shaped first film having a rectangular-shaped first open space therewithin;
   a semiconductor element being located within said first open space of said first film;
   terminals formed on said semiconductor element;

a rectangular-shaped second film lying on said semiconductor element inside an arrangement of said terminals;

a closed-loop wiring formed on said second film;

at least one signal wiring formed on said first film and inwardly extending from said first film to terminate at one of said terminals; and four ground wirings formed on said first film, one of said four ground wirings being located, respectively, on one of said four sides of said rectangular-shaped film, each of said ground wirings inwardly extending from said first film to connect said closed-loop wiring through one of said terminals.

19. The semiconductor device as set forth in claim 18, wherein a plurality of signal and ground wirings are formed on said first film so that each of said ground wirings is located intermediate between said signal wirings.

20. A semiconductor device comprising:

a first film having a first open space therewithin;

a semiconductor element being located within said first open space of said first film;

terminals formed on said semiconductor element;

a second film having a second open space therewithin, said first film being located in said second open space;

a third film lying on said semiconductor element inside an arrangement of said terminals;

a first closed-loop wiring formed on said second film;

a second closed-loop wiring formed on said third film;

at least one signal wiring formed on said first film, said signal wiring inwardly extending from said first film to terminate at one of said terminals; and at least one ground wiring formed on said first film, said ground wiring inwardly extending from said first film to connect with said second closed-loop wiring through one of said terminals and outwardly extending from said first film to connect with said first closed-loop wiring.

21. The semiconductor device as set forth in claim 20, wherein a plurality of signal and ground wirings are formed on said first film so that each of said ground wirings is located intermediate between said signal wirings.

22. The semiconductor device as set forth in claim 20, wherein said first, second and third films are rectangular in shape, and said first and second open spaces are rectangular in shape.

23. The semiconductor device as set forth in claim 22, wherein there are formed four ground wirings so that each of them is located on each of four sides of said rectangular-shaped first film.

* * * * *